United States Patent
Zhou

(10) Patent No.: US 9,046,705 B2
(45) Date of Patent: Jun. 2, 2015

(54) METHOD FOR PREPARING FLEXIBLE DISPLAY DEVICE

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/127,942

(22) PCT Filed: Nov. 12, 2012

(86) PCT No.: PCT/CN2012/084479
§ 371 (c)(1),
(2) Date: Dec. 19, 2013

(87) PCT Pub. No.: WO2013/135066
PCT Pub. Date: Sep. 19, 2013

(65) Prior Publication Data
US 2014/0141683 A1    May 22, 2014

(30) Foreign Application Priority Data

Mar. 14, 2012  (CN) .......................... 2012 1 0067188

(51) Int. Cl.
G02F 1/1333    (2006.01)
H01L 51/00    (2006.01)

(52) U.S. Cl.
CPC ..... *G02F 1/133305* (2013.01); *H01L 2227/326* (2013.01); *H01L 2251/5338* (2013.01); *H01L 51/0097* (2013.01); *H01L 51/003* (2013.01)

(58) Field of Classification Search
USPC ............................... 156/230–241; 445/24–25
See application file for complete search history.

(56) References Cited

U.S. PATENT DOCUMENTS 8,034,206 B2    10/2011    Kim et al.
2008/0292786 A1    11/2008    Hatano et al.
(Continued)

FOREIGN PATENT DOCUMENTS

CN    1256794 A    6/2000
CN    101009207 A    8/2007
(Continued)

OTHER PUBLICATIONS

First Office Action (Chinese language) issued by the State Intellectual Property Office ("SIPO") on Mar. 8, 2013, for patent application 201210067188.2, 4 pages.
(Continued)

*Primary Examiner* — Mariceli Santiago
*Assistant Examiner* — Brenitra M Lee

(57) ABSTRACT

A method for preparing a flexible display device comprises: forming a release layer (2) on a transparent hard substrate (1), the release layer (2) being made of an ultraviolet light decomposition material to which an inert substance is added; integrating a flexible substrate (4) onto the transparent hard substrate (1) having the release layer (2), the flexible substrate (4) being opposite to a side having the release layer (2) of the transparent hard substrate (1); forming a display component (5) on the flexible substrate (4); and exposing a side far away from the release layer (2) of the transparent hard substrate (1) to ultraviolet rays (7), so as to trigger the release layer (2) to undergo a photochemical reaction with gas releasing, so that the transparent hard substrate (1) is separated from the flexible substrate (4). The method for preparing a flexible display device can simplify a process of producing a flexible display device.

13 Claims, 3 Drawing Sheets

(56) References Cited

U.S. PATENT DOCUMENTS

2009/0266471 A1    10/2009  Kim
2011/0052836 A1     3/2011  Kim et al.
2014/0141683 A1     5/2014  Zhou

FOREIGN PATENT DOCUMENTS

| CN | 101311789 A | 11/2008 |
| CN | 101877310 A | 11/2010 |
| CN | 101937157 A | 1/2011 |
| CN | 102089858 A | 6/2011 |
| CN | 102636898 A | 8/2012 |
| JP | 2003027017 A | 1/2003 |
| TW | 200712607 B | 1/2007 |

OTHER PUBLICATIONS

English translation of first Office Action for patent application 201210067188.2, listed above, 6 pages.
Second Office Action (Chinese language) issued by the State Intellectual Property Office ("SIPO") on May 23, 2013, for patent application 201210067188.2, 4 pages.
English translation of second Office Action for patent application 201210067188.2, listed above, 6 pages.
Third Office Action (Chinese language) issued by the State Intellectual Property Office ("SIPO") on Sep. 4, 2013, for patent application 201210067188.2, 4 pages.
English abstract of CN 101877310A, 2 pages.
English abstract of JP 2003027017A, 2 pages.
English abstract of TW 200712607B, 1 page.
PCT International Preliminary Report on Patentability issued by the International Bureau of WIPO for International application No. PCT/CN2012/084479, issued Mar. 14, 2012, 10 pages.
English Translation of CN101009207A; 18 pages.
English Translation of CN1256794A; 65 pages.
English Translation of CN102089858A; 15 pages.
English Translation of CN101937157A; 16 pages.
Espacenet Bibliographic Data, Abstract of CN102636898A; 1 page.
Espacenet Bibliographic Data, Abstract of CN101311789A; 1 page.
PCT International Search Report ("ISR") (Chinese Language) issued by WIPO on Feb. 14, 2013 for Chinese Patent Application No. 201210067188.2; fourteen (14) pages.

METHOD FOR PREPARING FLEXIBLE DISPLAY DEVICE

CROSS REFERENCE TO RELATED APPLICATIONS

This application is based on International Application No. PCT/CN2012/084479 filed on Nov. 12, 2012, which claims priority to Chinese National Application No. 201210067188.2 filed on Mar. 14, 2012, the contents of which are incorporated herein by reference.

FIELD

The present disclosure relates to a fabricating method of flexible display apparatus, in particular to an attachment and detachment process for a flexible display apparatus based on ultra violet (UV) decomposable material and UV sensitive reactivity thereof.

BACKGROUND

Liquid crystal display (LCD) technology has gone though rapid development in last decade. Both screen size and display quality have been greatly improved. By continuous efforts, LCD now has various properties comparable to conventional cathode ray tube (CRT) display and there has been a trend to replace CRT with LCD.

With continuous production increase of LCD, manufacturers are facing increasingly fierce competition, therefore the manufacturers strives for more ability to compete and more product adds-on with continuous efforts of lowering production cost, improving product quality and adding more functionalities.

Flexible display product has huge market potential due to unique shape and humanized usage. There are two major conventional fabricating methods of flexible display apparatus. In first method of roll to roll process, the display devices are fabricated directly on a flexible substrate by printing. Due to limitation of printing technology, this method can only be used to fabricate low end product such as RFID and has poor yield and reliability. In second method of attachment and release, a flexible substrate is attached onto a rigid backplate before display devices are fabricated, then the rigid backplate is removed. This method has higher accuracy and is easier to be employed in a large scale due to equipment similarities with conventional TFT-LCD array fabrication.

In a conventional attachment and release method, an organic plastic substrate is attached onto a glass substrate by an adhesive. Next, after the display devices are fabricated on the plastic substrate, a high energy laser beam is scanned across back side of the glass substrate so that the adhesive lost adhesiveness due to this aging process. In this case, the organic plastic substrate can be released from the glass substrate. This method requires high energy laser scanning, thus has low throughput and poor consistency in release process.

SUMMARY

The present disclosure provides a simplified fabricating method of a flexible display apparatus.

According to one aspect of the present disclosure, a fabricating method of a flexible display apparatus comprises steps of: forming a release layer on a transparent rigid substrate, the release layer being made of UV decomposable material added with inert material; attaching a flexible substrate onto the transparent rigid substrate formed with the release layer, the flexible substrate facing the side of the transparent rigid substrate formed with the release layer; forming display devices on the flexible substrate; and irradiating UV lights on a side of the transparent rigid substrate away from the release layer so as to induce an actinic reaction of the release layer, which release gases to separate the transparent rigid substrate and the flexible substrate.

In one embodiment, the step of attaching a flexible substrate onto the transparent rigid substrate formed with the release layer comprises: applying an adhesive onto the transparent rigid substrate formed with the release layer; and attaching the flexible substrate onto the transparent rigid substrate formed with the adhesive.

In one embodiment, at least part of the inert material is adhesive; and the step of attaching a flexible substrate onto the transparent rigid substrate formed with the release layer is a step of attaching the flexible substrate directly onto the transparent rigid substrate formed with the release layer.

In one embodiment, the UV decomposable material is perchloric acid 3(5)-amino hydrazine-1,2,4-triazolone or perchlorylamide.

In one embodiment, the inert material is at least one material selected from a group consisting of polyimide, acrylate, silicon dioxide, silicon nitride, zirconium oxide and titanium oxide.

In one embodiment, the transparent rigid substrate is a colorless glass substrate or a glass substrate with a color not containing yellow component.

In one embodiment, the flexible substrate is a yellow flexible substrate.

In one embodiment, the flexible substrate is made of at least one material selected from a group consisting of polyimide, polyethylene naphthalate polyethylene terephthalate, fiber reinforced plastic, polyethersulphone, polyarylester and polycarbonate.

In one embodiment, the adhesive is a pressure sensitive adhesive or thermal sensitive adhesive.

In one embodiment, the fabricating method further comprises a step of cutting after the step of forming display devices on the flexible substrate and before the step of irradiating UV lights on a side of the transparent rigid substrate away from the release layer so as to induce a actinic reaction of the release layer, which release gases to separate the transparent rigid substrate and the flexible substrate.

In the present disclosure, the release layer is formed of UV decomposable material added with inert material and the flexible display apparatus is fabricated by the attachment and release method, therefore a flexible display apparatus can be fabricated at low temperature in a way similar to conventional fabricating method of TFT-LCD array substrate. In this way, the fabricating process is simplified and the production cost of the flexible display apparatus is reduced.

BRIEF DESCRIPTION OF THE DRAWINGS

The accompanying drawings of technical solutions of the present disclosure or the prior art are briefly described as following for better illustration of the technical solutions of the present disclosure or the prior arts. It is apparent that the accompanying drawings as described below are mere illustrations for some embodiments of the technical solutions of the present disclosure and thus other accompanying drawings are readily conceivable based on these accompanying drawings for the skilled in the art without creative works.

DETAILED DESCRIPTION OF THE PREFERRED EMBODIMENTS

The technical solutions of embodiments of the present disclosure will be described in more detail with reference to the accompanying drawings. It is apparent that the embodiments as described are merely a part of embodiments of the present disclosure and do not represent all embodiments. All other embodiments readily conceivable by the skilled in the art based on the described embodiments of the present disclosure without creative works fall into the protection scope of the present disclosure.

Ultra violet (UV) decomposable material is a material which induces actinic reaction when UV light is irradiated thereon and the products of the reaction contain gas component. The embodiments of the present disclosure provides a fabricating method of flexible display apparatus, in which the release layer is formed of the UV decomposable material added with a substantial amount of inert material (which do not react with UV decomposable material) and the flexible display apparatus is fabricated by the attachment and release method, therefore a flexible display apparatus can be fabricated at low temperature in a way similar to conventional fabricating method of TFT-LCD array substrate. In this way, the production cost of the flexible display apparatus is reduced.

Figure 8:
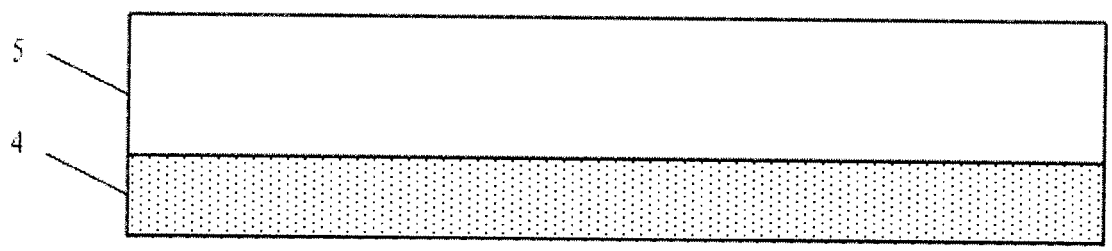
FIG. 8 is a schematic view showing a flexible display device after removing adhesive and the release layer.

Referring to FIG. 8, a flexible display apparatus fabricated by the embodiments of the present disclosure can comprise a flexible substrate 4 and display devices 5 formed on the flexible substrate 4. The display devices 5 can be a cholesteric liquid crystal device (LCD), an organic light emitting diode (OLED), electrophoresis device or polymer dispersed liquid crystal (PDLC) device and so on.

Figure 1:
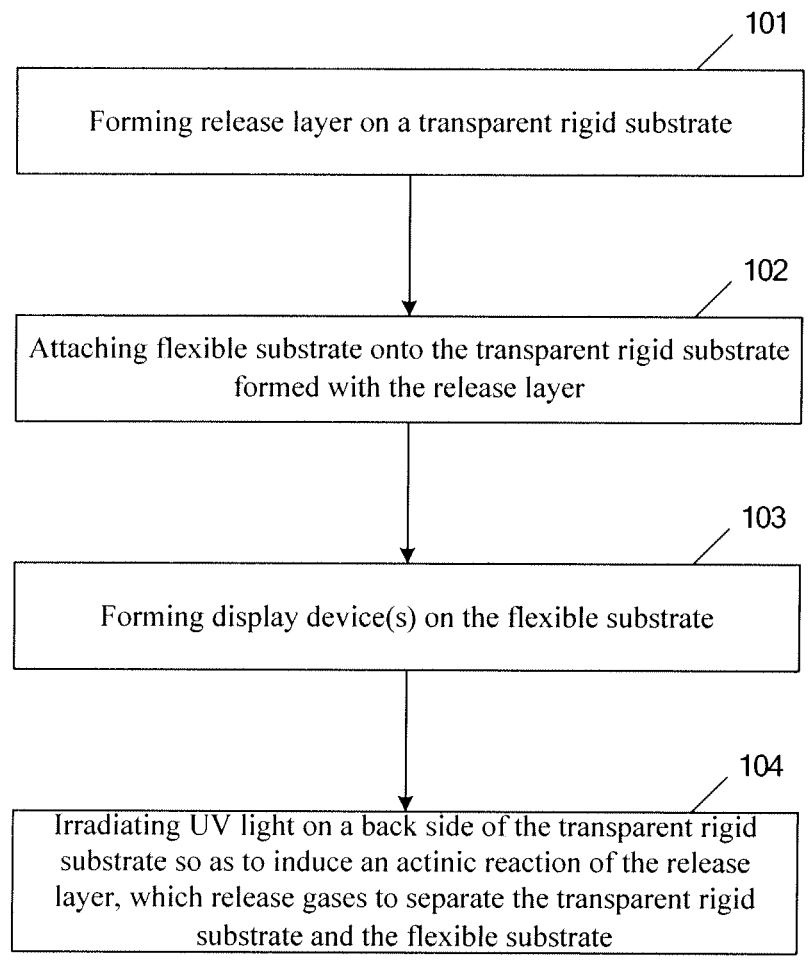
FIG. 1 is a flow chart of a fabricating method of flexible display apparatus according to an embodiment of present disclosure.
Figure 2:
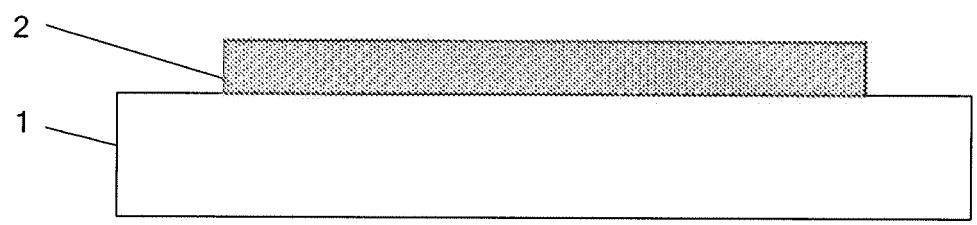
FIG. 2 is a schematic view showing applying a release layer.

FIG. 1 is a flow chart of a fabricating method of flexible display apparatus according to an embodiment of present disclosure. As shown in FIG. 1, the fabricating method of the flexible display apparatus can comprise following steps. In step 101, a release layer 2 is formed on a transparent rigid substrate 1, as shown in FIG. 2.

The transparent rigid substrate is a colorless glass substrate or a glass substrate with a color not containing yellow component. In subsequent steps of fabricating method of the present disclosure, UV lights are irradiated on backside of the glass substrate, and UV lights are transmitted through the glass substrate to reach the release layer 2 to induce an actinic reaction to release gases. Since the material with yellow color tends to absorb UV light so that UV light can not transmit, the transparent rigid substrate in the embodiments of the present disclosure can not contain yellow component.

The release layer 2 is made of a material of the UV decomposable material added with inert material. The UV decomposable material is perchloric acid 3(5) amino hydrazine 1,2, 4-triazolone or perchlorylamide, or combination thereof. The inert material can be at least one material selected from a group consisting of polyimide, acrylate, silicon dioxide, silicon nitride, zirconium oxide and titanium oxide, which does not react with UV decomposable material. In practice, one or any combination of the material described above can be conceived.

In the present step, a substantial amount of inert material is added in the UV decomposable material to prepare a batch of material of release layer and the material of release layer is applied on the transparent rigid substrate 1 to form the release layer 2.

In step 102, the flexible substrate 4 is attached onto the transparent rigid substrate 1 formed with the release layer 2. The flexible substrate 4 faces the side of the transparent rigid substrate 1 formed with the release layer 2, as shown in FIG. 3 and FIG. 4.

The flexible substrate 4 can be made of at least one material selected from a group consisting of polyimide (PI), polyethylene naphthalate (PEN), polyethylene terephthalate (PET), fiber reinforced plastic (FRP), polyethersulphone (PES), polyarylester (PAR) and polycarbonate (PC). The flexible substrate 4 can also be made of a composite film of the materials as described above. The above materials can be modified and colored with yellow.

The step 102 can be implemented in two ways as following, for example.

Figure 3:
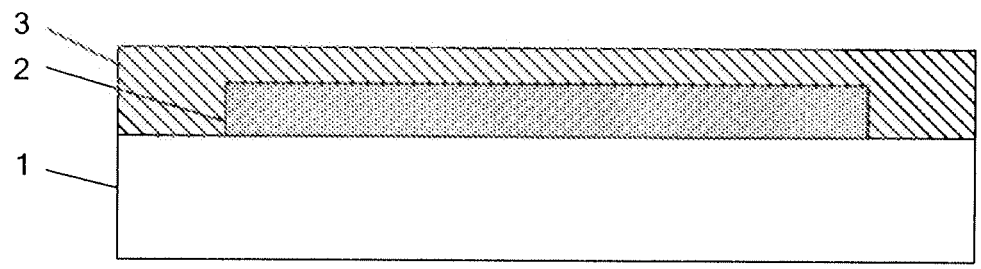
FIG. 3 is a schematic view showing applying an adhesive.
Figure 4:
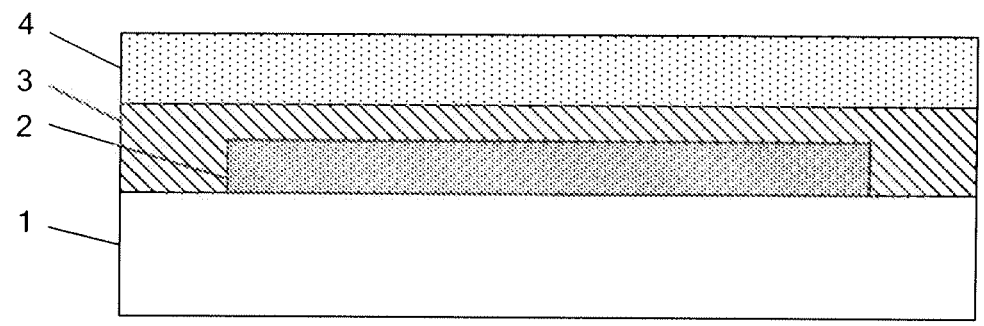
FIG. 4 is a schematic view showing attaching a flexible substrate.

In the first implementation, as shown in FIG. 3, firstly, an adhesive 3 is applied on the transparent rigid substrate 1 formed with the release layer 2.

Then as shown in FIG. 4, the flexible substrate 4 is attached on the transparent rigid substrate 1 applied with the adhesive 3. Optionally, the adhesive 3 can be cured by applying pressure or heat, so that the flexible substrate 4 and transparent rigid substrate 1 can be attached together uniformly and smoothly.

In this implementation, the release layer 2 is preferably completely disposed under the flexible substrate 4 and occupies less area than the flexible substrate 4. The adhesive 3 can be applied on the upper surface of the release layer 2 and the upper surface of the transparent rigid substrate 1 where the release layer 2 is not formed. This implementation can keep the flexible substrate 4 and the transparent rigid substrate 1 closely attached, prevent accidental detachment between the flexible substrate 4 and the transparent rigid substrate 1 in the fabricating process of subsequent display devices, and prevent erosion of the release layer 2 by various acids during etching in the fabricating process of subsequent display devices.

In the second implementation, during preparation the material of the release layer 2, at least part of the inert material added to the UV decomposable material can be adhesive. This way, the release layer can also be used as an adhesive. Then after applying the release layer 2, the flexible substrate 4 can be directly attached onto the transparent rigid substrate 1 formed with the release layer 2. Therefore, the second implementation is simpler than the first implementation.

The adhesive 3 can be a pressure sensitive adhesive or a thermal sensitive adhesive, instead of a photosensitive adhesive. For example, the adhesive 3 can be acrylate pressure sensitive adhesive.

In this implementation, the material of the release layer 2 also used as the adhesive can be applied only one time to form the release layer 2. The release layer 2 can be completely disposed below the flexible substrate 4 and occupy the same area as the flexible substrate 4. This implementation can keep the flexible substrate 4 and the transparent rigid substrate 1 closely attached due to larger contact area therebetween, and ensure that there is no waste material for the adhesive and the release layer.

Figure 5:
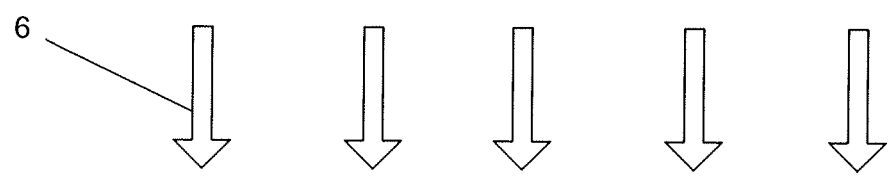
FIG. 5 is a schematic view showing fabricating display devices.
Figure 5:
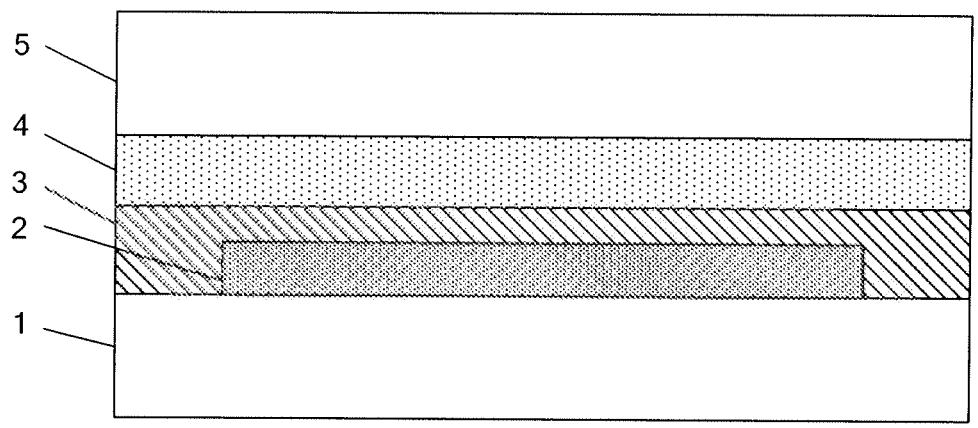

In step 103, display device(s) 5 is formed on the flexible substrate 4, as shown in FIG. 5.

As shown in FIG. 5, an array substrate of the display device 5 can be fabricated by conventional filming, lithography and etching process. Since the flexible substrate 4 is yellow and thereby absorb UV lights, the UV lights 6 used during fabricating process of the array substrate can not penetrate flexible substrate 4 to reach the release layer 2, which is kept unreactive during fabricating of display device 5.

Figure 6:
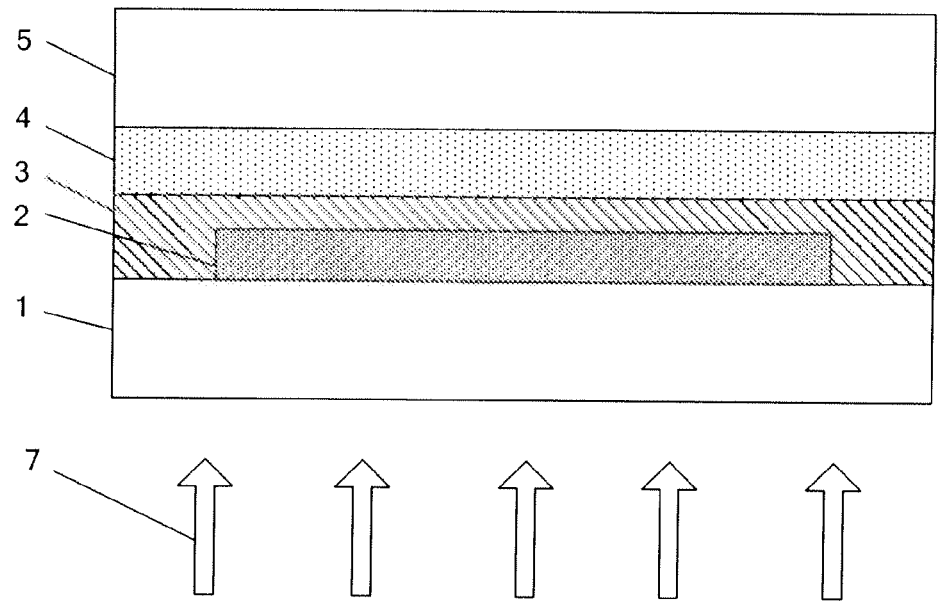
FIG. 6 is a schematic view showing irradiating a UV light on backside of the release layer.

In step 104, UV lights are irradiated on a side of the transparent rigid substrate 1 away from the release layer 2 so as to induce an actinic reaction of the release layer, which release gases to separate the transparent rigid substrate 1 and the flexible substrate 4, as shown in FIG. 6.

Figure 7:
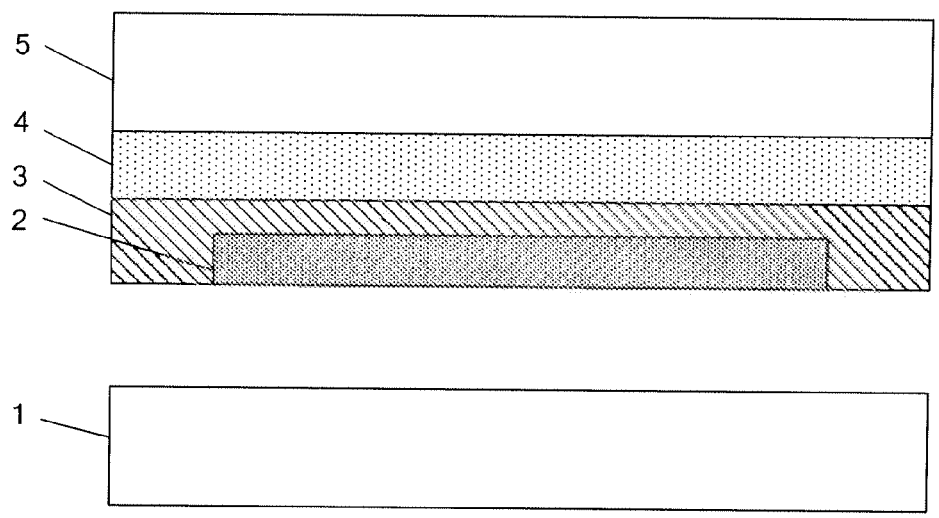
FIG. 7 is a schematic view showing separating flexible substrate and rigid substrate.

When the display device 5 is fabricated, UV lights 7 are irradiated on backside of the transparent rigid substrate 1. The UV decomposable material in the release layer 2 is sensitive to the UV lights 7, thus explosive components in the release layer 2 generate a substantial amount of gases to separate the transparent rigid substrate 1 and the flexible substrate 4, as shown in FIG. 7. Due to the presence of substantial amount of inert materials in the release layer 2, the flexible substrate 4 does not undergo plastic deformation (yield) although the released gas has certain impacts on the flexible substrate 4 and the adhesive 3.

In the fabricating process of the display device, one or more display devices (or so called panels) might be fabricated on a same flexible substrate, thus the substrate will be subjected to a subsequent cutting process to singularize panels for subsequent assembling process. In this case, the method according to the present disclosure can further comprise a cutting process. The step 104 of separating the transparent rigid substrate 1 and flexible substrate 4 can also be performed before or after the cutting process. If the step of 102 is performed with the first implementation, the step of separating the transparent rigid substrate 1 and flexible substrate 4 is preferably performed after the cutting process, since in the cutting process, the cutting line can be set in a position where there is no release layer applied so that a part of the adhesive can be cut off so as to facilitate the separation between the transparent rigid substrate 1 and flexible substrate 4.

Finally, the adhesive 3 and the release layer 2 left on the flexible substrate 4 are removed to form a flexible display apparatus shown in FIG. 8.

Since large area UV irradiation apparatus has been widely used in the liquid crystal display fabrication, the attachment of the flexible substrate, fabricating of display device and detachment of the flexible substrate can be achieved in a simple, consistent and speedy way at low temperature, therefore the throughput and product quality can be improved.

In the embodiments of the present disclosure, the flexible substrate is smaller than the transparent rigid substrate 1 so that the transparent rigid substrate 1 can completely support the flexible substrate 4 and make it more feasible to attach the flexible substrate 4 onto the transparent rigid substrate 1 formed with the release layer 2.

The above embodiments are intended only to illustrate the present invention and not limit the present invention. Various modifications and variations can be made by the skilled in the art without departing the spirit and scope of the present invention, such that all those equivalent solutions also fall into protection scope of the present invention which is defined by appended claims.

What is claimed is:

1. A fabricating method of a flexible display apparatus, comprising steps of: forming a release layer on a transparent rigid substrate, the release layer being made of UV decomposable material doped with inert material, the UV decomposable material is perchloric acid 3(5) amino hydrazine 1, 2, 4-triazolone or perchlorvlamide; attaching a flexible substrate onto the transparent rigid substrate formed with the release layer, the flexible substrate facing the side of the transparent rigid substrate formed with the release layer, the flexible substrate is a yellow flexible substrate; forming display devices on the flexible substrate; and irradiating UV lights on a side of the transparent rigid substrate away from the release layer so as to induce an actinic reaction of the release layer, which release gases to separate the transparent rigid substrate and the flexible substrate.

2. The fabricating method of claim 1, wherein the step of attaching a flexible substrate onto the transparent rigid substrate formed with the release layer comprises:
    applying an adhesive onto the transparent rigid substrate formed with the release layer;
    attaching the flexible substrate onto the transparent rigid substrate formed with the adhesive.

3. The fabricating method of claim 1, wherein
    all or part of the inert material is adhesive; and
    the step of attaching a flexible substrate onto the transparent rigid substrate formed with the release layer is a step of attaching the flexible substrate directly onto the transparent rigid substrate formed with the release layer.

4. The fabricating method of claim 1, wherein the inert material is at least one material selected from a group consisting of polyimide, acrylate, silicon dioxide, silicon nitride, zirconium oxide and titanium oxide.

5. The fabricating method of claim 1, wherein the transparent rigid substrate is a colorless glass substrate or a glass substrate with a color not containing yellow component.

6. The fabricating method of claim 1, wherein the flexible substrate is made of at least one material selected from a group consisting of polyimide, polyethylene naphthalate, polyethylene terephthalate, fiber reinforced plastic, polyethersulphone, polyarylester and polycarbonate.

7. The fabricating method of claim 2, wherein the adhesive is a pressure sensitive adhesive or thermal sensitive adhesive.

8. The fabricating method of claim 1, further comprising a step of cutting the flexible substrate after the step of forming display devices on the flexible substrate and before the step of irradiating UV lights on a side of the transparent rigid substrate away from the release layer so as to induce a actinic reaction of the release layer, which release gases to separate the transparent rigid substrate and the flexible substrate.

9. The fabricating method of claim 2, wherein
    all or part of the inert material is adhesive; and
    the step of attaching a flexible substrate onto the transparent rigid substrate formed with the release layer is a step of attaching the flexible substrate directly onto the transparent rigid substrate formed with the release layer.

10. The fabricating method of claim 2, wherein the transparent rigid substrate is a colorless glass substrate or a glass substrate with a color not containing yellow component.

11. The fabricating method of claim 3, wherein the transparent rigid substrate is a colorless glass substrate or a glass substrate with a color not containing yellow component.

12. The fabricating method of claim 2, wherein the inert material is at least one material selected from a group consisting of polyimide, acrylate, silicon dioxide, silicon nitride, zirconium oxide and titanium oxide.

13. The fabricating method of claim 3, wherein the inert material is at least one material selected from a group consisting of polyimide, acrylate, silicon dioxide, silicon nitride, zirconium oxide and titanium oxide.

* * * * *